(12) United States Patent
Kanazashi et al.

(10) Patent No.: US 6,337,833 B1
(45) Date of Patent: *Jan. 8, 2002

(54) MEMORY DEVICE

(75) Inventors: Kazuyuki Kanazashi; Toshiya Uchida; Masaki Okuda, all of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/346,919

(22) Filed: Jul. 2, 1999

(30) Foreign Application Priority Data

Jul. 14, 1998 (JP) .............................. 10-198590

(51) Int. Cl.⁷ ................................................ G11C 8/00
(52) U.S. Cl. ................................... 365/233; 365/189.05
(58) Field of Search ........................... 365/233, 189.05, 365/189.01

(56) References Cited

U.S. PATENT DOCUMENTS

| | | | | |
|---|---|---|---|---|
| 5,768,213 A | * | 6/1998 | Jung ........................... | 365/233 |
| 5,893,925 A | * | 4/1999 | Sawada ....................... | 365/236 |
| 5,930,198 A | * | 7/1999 | Ryan ........................... | 365/233 |
| 5,959,900 A | * | 9/1999 | Matsubara ................... | 365/233 |
| 6,064,627 A | * | 9/1999 | Sakurai ....................... | 365/233 |

* cited by examiner

*Primary Examiner*—A. Zarabian
(74) *Attorney, Agent, or Firm*—Arent Fox Kintner Plotkin & Kahn, PLLC (57) ABSTRACT

One aspect of the present invention is that, when the memory is in the non-power-down state, the supply of clock signals to the data output circuit is limited to the read status after the reception of a read command, and no clock signal supply is performed when either the active status or the write status is in effect. In the best aspect, furthermore, in the read status after the reception of a read command, the supply of clock signals to the data output circuit starts after a number of clock signals corresponding to a set CAS latency following the read command, and stops after a number of clock signals corresponding to a set burst length, after the output of the read out data from the data output circuit starts. Accordingly, even in the non-power-down state, clock signals are only supplied during the time required for the read out data to be actually output from the data output circuit to the outside, whereby it is possible to reduce the number of clock signal supply actions that require large current drive.

8 Claims, 6 Drawing Sheets

MEMORY DEVICE

BACKGROUND OF THE INVENTION

1. Field of the Invention

This invention relates to a high-speed memory device the internal circuitry whereof operates in synchronization with a clock signal, and particularly to a memory device wherewith the current consumed in conjunction with clock signal supply is reduced.

2. Description of the Related Art

With a synchronous DRAM (SDRAM) of the clock-synchronized type, an input buffer inputs externally supplied signals in synchronous with supplied clock signals, the internal circuitry operates in pipeline fashion synchronously with the clock signals, and read out data are output from a data output circuit synchronously with the clock signals. By effecting synchronization with the clock signals, high-speed operation is realized.

Such a SDRAM, from the combination of control signals supplied synchronously with the clock signal, is controlled in an active status, a read status, a write status, and a recharge status, etc. In general, after an active command is received for controlling in the active status, either a read command that effects the read status or a write command that effects the write status is supplied. Last of all, a standby status is effected after receiving a precharge command. At all times when the power-down state is not in effect, the clock signals supplied from the outside are taken in, internal clock signals are generated, and those internal clock signals are supplied to the internal circuitry. In the power-down state, taking in the clock signals is disabled, and no internal clock signals are generated.

The internal circuitry to which the internal clock signals are supplied includes, firstly, an input buffer for inputting data and address signals and the like synchronized with the clock signals, secondly, an internal reading circuit having a clock-synchronized pipeline configuration for reading out data from memory cells, and, thirdly, a data output circuit for outputting the read out data to the outside synchronously with the clock signals. Accordingly, in a conventional clock-synchronized memory device such as a SDRAM, in the non-power-down state, the clock signals taken in are branched and supplied, respectively, to the input buffer, internal read circuit, and data output circuit noted above.

There is a demand, however, for clock-synchronized memory devices to be faster while at the same time consuming less power. Making the clock frequency higher in order to achieve higher speeds involves raising the frequency of drive actions in conjunction with supplying clock signals to the internal circuitry, and, hence, an increase in power consumption. Thus faster speeds and lower power consumption are mutually inconsistent demands.

In particular, the data output circuits, which is one of the components mentioned above to which clock signals are supplied, are positioned adjacent to the data I/O terminals (DQ terminals) that are deployed in a plurality on the chip. Accordingly, the clock signal supply lines for supplying the internal clock signals are lines that extend over long distances from the clock signal supply circuit to the plurality of data output circuits. Such multiple clock signal supply lines that extend over long distances constitute a large load, and the clock signal supply circuit that drives this load requires large drive transistors, which leads, as a result, to large current consumption.

That being so, an object of the present invention is to provide a clock-synchronized memory device wherewith the current consumption is reduced in the clock signal supply circuit for supplying clock signals to the internal circuitry.

Another object of the present invention is to provide a clock-synchronized memory device wherewith the current consumption associated with the supply of clock signals to the data output circuit in the clock signal supply circuit is made small.

SUMMARY OF THE INVENTION

In order to realize the object stated above, one aspect of the present invention is that, when the memory is in the non-power-down state, the supply of clock signals to the data output circuit is limited to the read status after the reception of a read command, and no clock signal supply is performed when either the active status or the write status is in effect. In the best aspect, furthermore, in the read status after the reception of a read command, the supply of clock signals to the data output circuit starts after a number of clock signals corresponding to a set CAS latency following the read command, and stops after a number of clock signals corresponding to a set burst length, after the output of the read out data from the data output circuit starts. Accordingly, even in the non-power-down state, clock signals are only supplied during the time required for the read out data to be actually output from the data output circuit to the outside, whereby it is possible to reduce the number of clock signal supply actions that require large current drive.

Furthermore, in another aspect of the present invention, the supply of clock signals to the input buffer that inputs supplied data and address signals synchronized with the clock, in the non-power-down state, is performed both when in the read status and at times other than when in the read status. Furthermore, clock signals are also supplied to the internal read circuit that reads out data contained in the memory cell region noted earlier synchronously with the clock, both when in the read status and at times other than when in the read status. When the memory is in the non-power-down state, the timing for the input signals going to the input buffer cannot be predicted beforehand, wherefore the supply of clock signals to the input buffer is continued irrespective of the read status being in effect. When the memory is in the non-power-down state, moreover, the internal read circuit is performing a pipeline operation, wherefore stopping the clock leads to confusion in the pipeline operation. The supply of clock signals to the internal read circuit, therefore, is continued irrespective of the read status being in effect.

In order to realize the objects stated earlier, one aspect of the present invention is a memory device operating in synchronization with a clock signal, comprising: a memory cell region for storing data; an internal read circuit for reading out data stored in said memory cell region in synchronization with said clock signal; a data output circuit for outputting data read out from said internal read circuit in synchronization with said clock signal; and a clock signal supply circuit for supplying said clock signal to said data output circuit, wherein: said clock signal supply circuit supplies said clock signal to said data output circuit when in a read mode wherein said read data are output from said data output circuit, and does not supply said clock signal to said data output circuit when not in said read mode.

In a preferable embodiment of the present invention, furthermore, the clock signal supply circuit supplies the clock signal to the data output circuit, in the read mode after the reception of a read command, during the time interval from the completion of a number of clock pulses corresponding to a set CAS latency after the reception of the read command, to the completion of a number of clock pulses corresponding to a set burst length after the output of read data from the data output circuit has started.

DESCRIPTION OF THE PREFERRED EMBODIMENTS

Embodiment aspects are now described with reference to the drawings. However, the technical scope of the present invention is not limited to or by these embodiment aspects.

Figure 1:
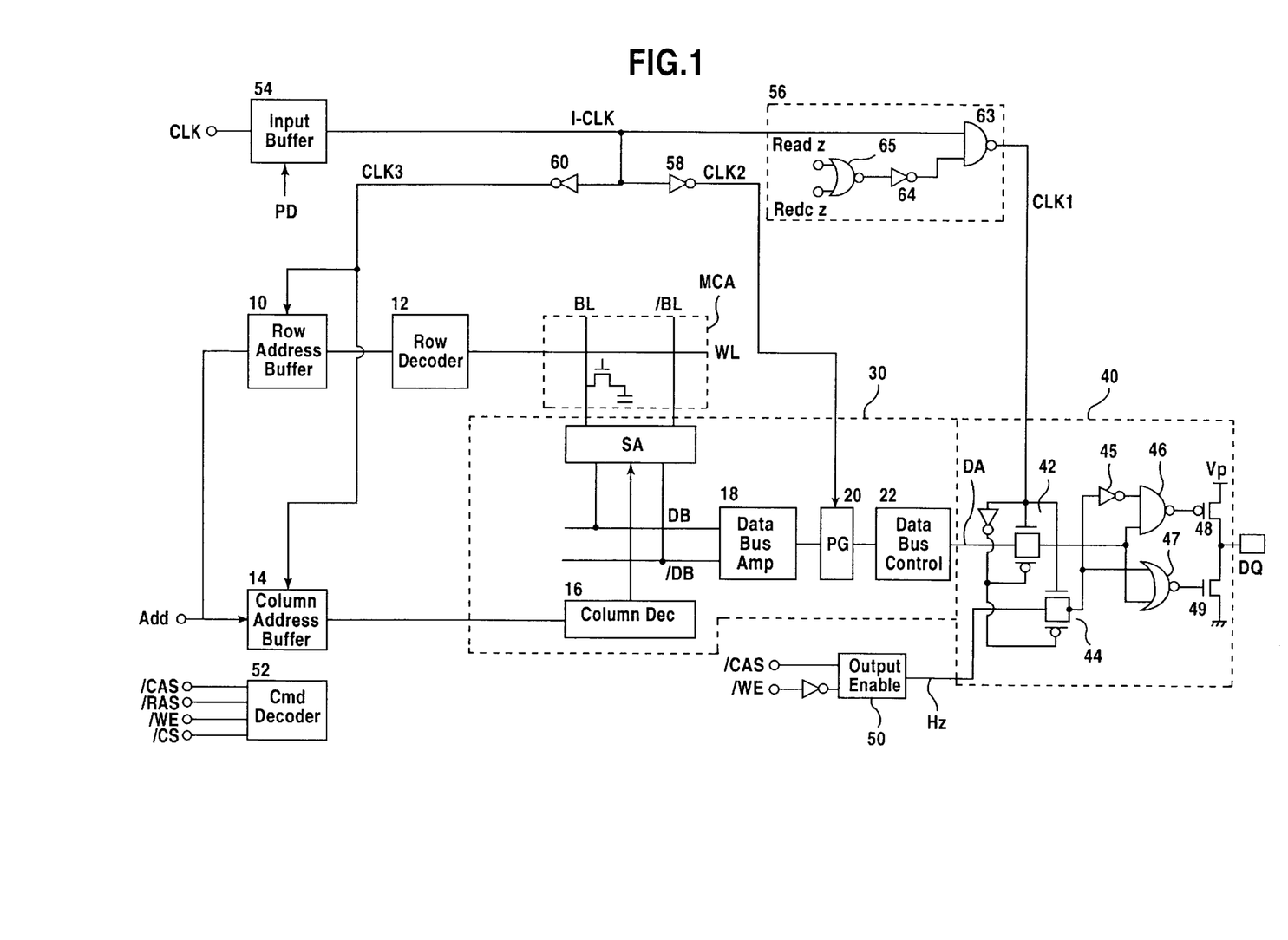
FIG. 1 is an overall schematic diagram of a chip for an SDRAM of the present invention.

FIG. 1 is an overall schematic diagram of an SDRAM in one aspect of an embodiment of the present invention. A memory cell array MCA comprises a plurality of word lines WL and bit lines BL and /BL, and memory cells each comprising one transistor and one capacitor at the intersections thereof. Row addresses in the row direction are loaded in by an address buffer 10 and decoded by a row decoder 12, and a selected word line WL is driven. In conjunction with the driving of the word line WL, very small voltages corresponding to the stored data are generated on the bit lines BL and /BL, and those very small voltages are amplified by a sense amp SA that is connected to the bit line pair. The operation up to this point is the row side (RAS system) operation.

Read data detected by the sense amp SA are selected by a column decoder 16 that decodes addresses loaded into a column address buffer 14 and output to a pair of data bus lines DB and /DB. The pair of data buses DB and /DB are amplified by a data bus amp 18, and the amplified read data are supplied to a data output circuit 40 via a pipeline gate 20 and a data bus control circuit 22. An internal data read circuit 30 is configured by the data bus amp 18 and the data bus control circuit 22. This internal data read circuit 30 corresponds to a column-system internal read circuit after taking in a column address.

The data output circuit 40 as well as a data input circuit (not shown) are connected to the I/O terminal DQ. To this data output circuit 40 are supplied read data from the internal read circuit 30 and a high-impedance control signal Hz for maintaining the transistors in the CMOS inverters 48 and 49 in the output stage in a high-impedance condition. When the high-impedance control signal Hz is high (H), the output at the NOR gate 47 goes low (L) and the output at the NAND gate 46 goes high (H), as a result of which the transistors 48 and 49 both become non-conducting, and a high-impedance state is effected relative to the I/O terminal DQ. When this happens, data are taken in on the data input circuit (not shown) side. When the high-impedance control signal Hz is low (L), the outputs at the NOR gate 47 and NAND gate 46 will be either high (H) or low (L) depending on the level of the read data DA, one or other of the transistors 48 and 49 will conduct, and the I/O terminal DQ will be driven.

To a command decoder 52 are supplied, from the outside, command control signals /CAS, /RAS, /WE, and /CS. These signals are decoded, and mode control signals (not shown) corresponding thereto are output and supplied to corresponding internal circuits to control the functioning thereof.

One of the features of the SDRAM is that, in synchronization with the clock signal CLK, signals are taken in from the outside, the internal circuits are activated, and data are output to the outside. That being so, the clock signal CLK supplied from the outside, as diagrammed, is input by a clock input buffer 54, amplified, and supplied as an internal clock signal I-CLK to the respective corresponding circuits. More specifically, a control clock signal CLK1 is supplied to the data output circuit 40 via a first clock signal supply circuit 56. In response to this control clock signal CLK1, gates 42 and 44 in the data output circuit 40 open, so that the read data DA and the high-impedance control signal Hz are supplied, and the data output circuit 40 is activated.

To the internal data read circuit 30 is supplied a control clock signal CLK2 via a second clock signal supply circuit 58 (comprising an inverter). The internal data read circuit 30 effects a pipeline configuration, and, in response to the control clock signal CLK2, the pipeline gate 20 is opened and the internal operation is synchronized with the clock signals. A control clock signal CLK3 is supplied via a third clock signal supply circuit 60 to the address buffers 10, 14 that inputs address signals. In this address buffers 10, 14, address signals Add from the outside are input, at the rising edge of the control clock signal CLK3.

As described in the foregoing, the clock signal CLK supplied from the outside is, when the non-power-down state is in effect, taken in, branched, and supplied to the data output circuit 40, the internal data read circuit 30, and the address buffers 10, 14, respectively, through the respective clock signal supply circuits. Each of these circuits, i.e. 40, 30, 10, and 14, function in response to the control clock signals CLK1, CLK2, and CLK3, respectively, which are supplied thereto. In the power-down state, moreover, the taking in of the external clock signal CLK is disabled by a power-down mode signal PD, whereupon no clock signal is supplied to the internal circuitry.

Figure 2:
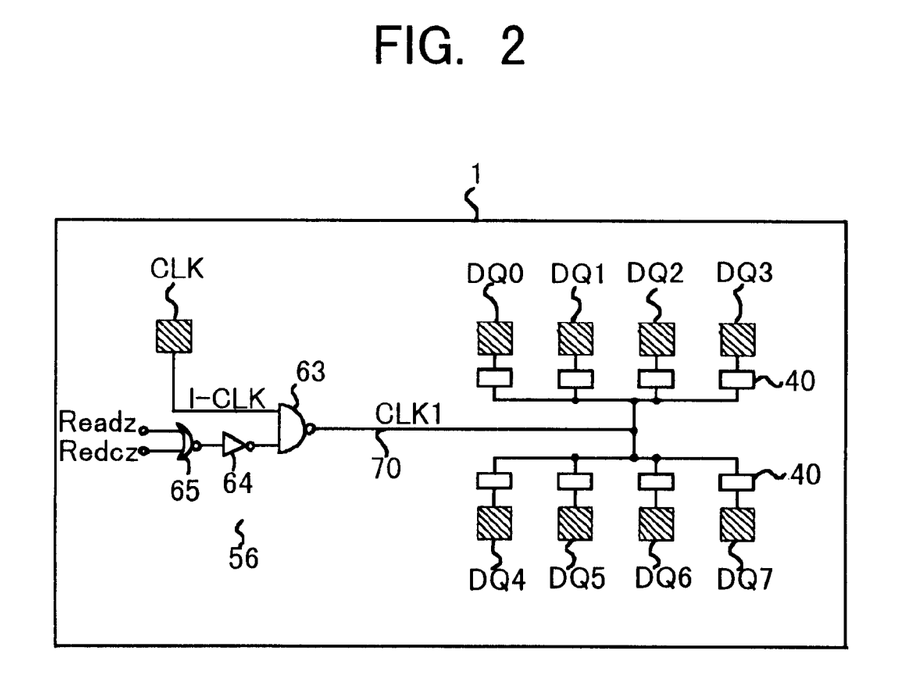
FIG. 2 is an overall schematic diagram of an SDRAM chip.

In FIG. 2 is given an overall diagram of a SDRAM chip. As diagrammed in FIG. 2, inside a chip 1 are comprised a group of I/O terminals DQ0–DQ7, data output circuits 40 corresponding thereto, a clock signal input terminal CLK, and a clock signal supply circuit 56. As diagrammed in FIG. 2, moreover, multiple data I/O terminals DQ are deployed in a wide range inside the chip, each I/O terminal having a data output circuit 40 connected thereto. Accordingly, in order for the clock signal CLK to be supplied to these data output circuits 40, the clock signal supply circuit 56 must drive a clock signal supply line 70 over a long distance with a heavy load. It requires much current consumption to drive this clock signal supply line 70 because of its long length and large capacitive load.

Accordingly, as diagrammed in FIG. 1, in supplying clock signals to the data output circuit 40, the control clock signal CLK1 is supplied to the data output circuit 40 only during the time when read data need to be output from the data output circuit 40 during the time interval from the active status wherein an active command is supplied to the recharge status wherein a recharge command is supplied. Therefore, a NAND gate 63 is provided in the clock signal supply circuit 56, to one input whereof is supplied the clock signal I-CLK, and to the other input whereof is supplied the output signal of the inverter 64 generated from the clock supply control signals Readz and Redcz. That being so, when either of the clock supply control signals Readz and Redcz is high (H), the NAND gate 63 is open, and the clock signal I-CLK is supplied via the NAND gate 63 to the data output circuit 40 as the control clock signal CLK1.

These clock supply control signals Readz and Redcz go high (H), in a read status following an active status, to enable clock signal supply. In the active status or write status, for example, both of the clock supply control signals Readz and Redcz go low (L) to disable clock signal supply.

In another example, which actually is to be preferred, while in the read status following reception of a read command, the clock supply control signals Readz and Redcz, enter a clock signal supply enabled state (H level) after a clock period for a preset CAS latency after receiving the read command, and enter a clock signal supply disabled state (L level) after the output of read data for the burst length is finished. The CAS latency and burst length mentioned here are set beforehand in an upper-level memory controller. Accordingly, in response to this preset value, the start timing and end timing for the supply of clock signals to the data output circuit 40 is controlled so as to be optimized.

Figure 3:
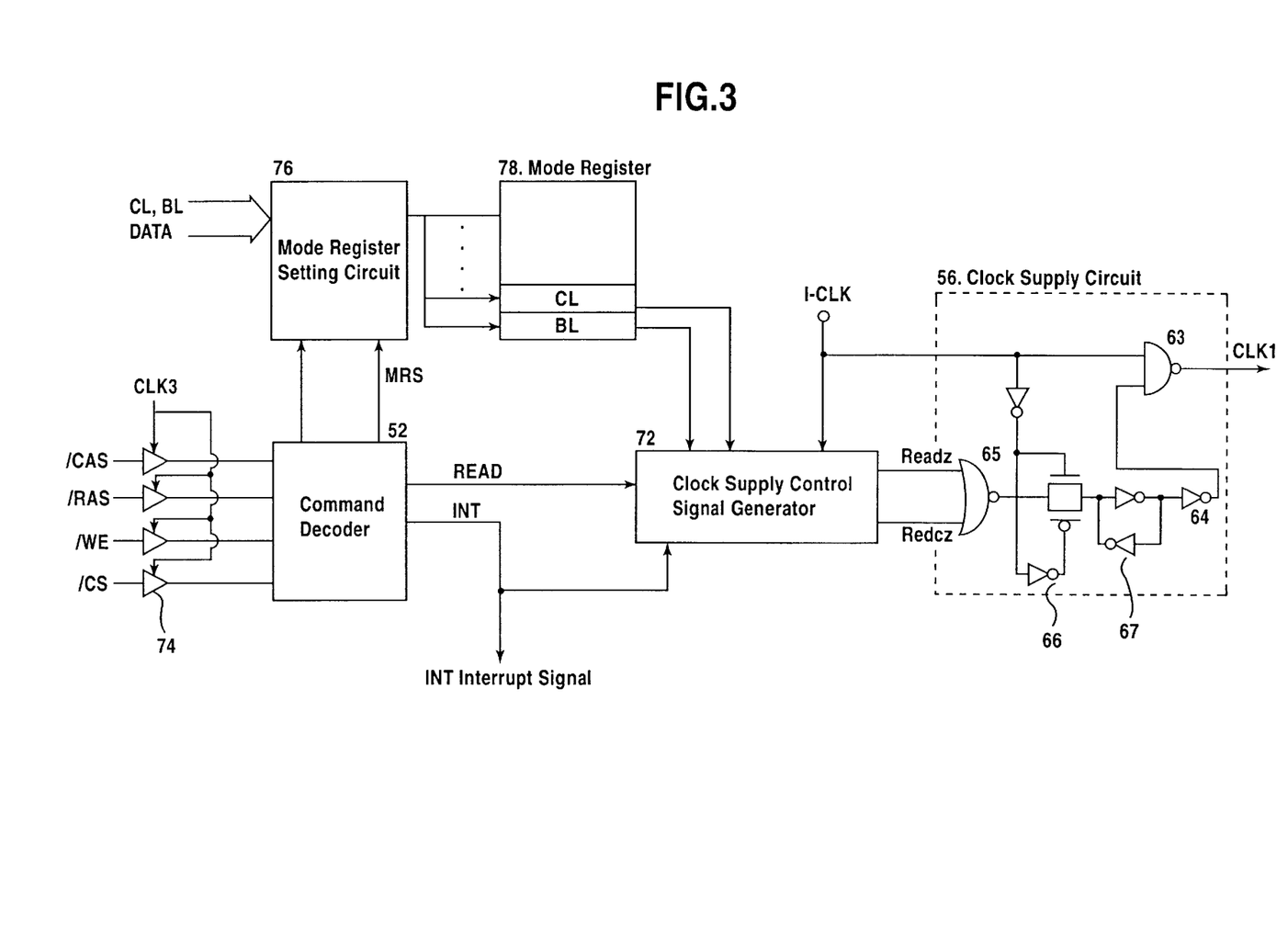
FIG. 3 is a schematic diagram of a circuit configuration for generating clock signal supply/control signals.

FIG. 3 is a schematic diagram of a circuit for generating the clock supply control signals Readz and Redcz. In this example, the preferable example described above is implemented. The clock supply control signals Readz and Redcz are generated by a clock supply control signal generator circuit 72. To the memory device are supplied control signals /CAS, /RAS, /WE, and ICS from the upper-level memory controller (not shown). These control signals are taken into an input buffer 74 synchronously with the control clock signal CLK3. These control signals are decoded in the command decoder 52. More specifically, a combination of control signals is decoded by a decoder circuit comprising NAND gates, etc. (not shown), and the respective control signals are output. In FIG. 3 are represented a read command signal READ, an interrupt signal INT, and a mode register set signal MRS. The internal circuits are controlled according to the control signals generated as a result of this decoding.

A mode register setting circuit 76, in response to the mode register set signal MRS supplied from the command decoder 52, sets the CAS latency value CL and the burst length value BL supplied from the data input terminal DATA in corresponding registers CL and BL inside a mode register 78. The settings in this mode register 78 are normally made according to data from an upper-level memory device when power to the memory device is turned on.

The CAS latency is the number of clock pulses from the reception of a read command to the output of the first read data from the I/O terminals DQ. The burst length is the number of continuous output data in the burst mode. These variables are set in the mode register 78 when the memory device is activated.

The command decoder 52 detects that a read command has been received from a combination of control signals and outputs a read command signal READ. This read command signal READ is supplied to the clock supply control signal generator circuit 72 and prompts the generation of the clock supply control signals Readz, Redcz. The command decoder 52 also detects that a write command has been received from a combination of control signals and outputs both a write command signal (not shown) and an interrupt signal INT. This interrupt signal INT is supplied both to the internal circuitry (not shown) and to the clock supply control signal generator circuit 72, and prompts termination of the clock supply control signals.

The clock supply control signal generator circuit 72 latches the read command signal READ and, in response thereto, generates the clock supply control signals during an interval of time that accords with the CAS latency CL and the burst length BL, and enables the clock signal supply circuit 56 to supply the clock signal I-CLK. During other times, the supply of the clock signal I-CLK from the clock signal supply circuit 56 is disabled.

Figure 4:
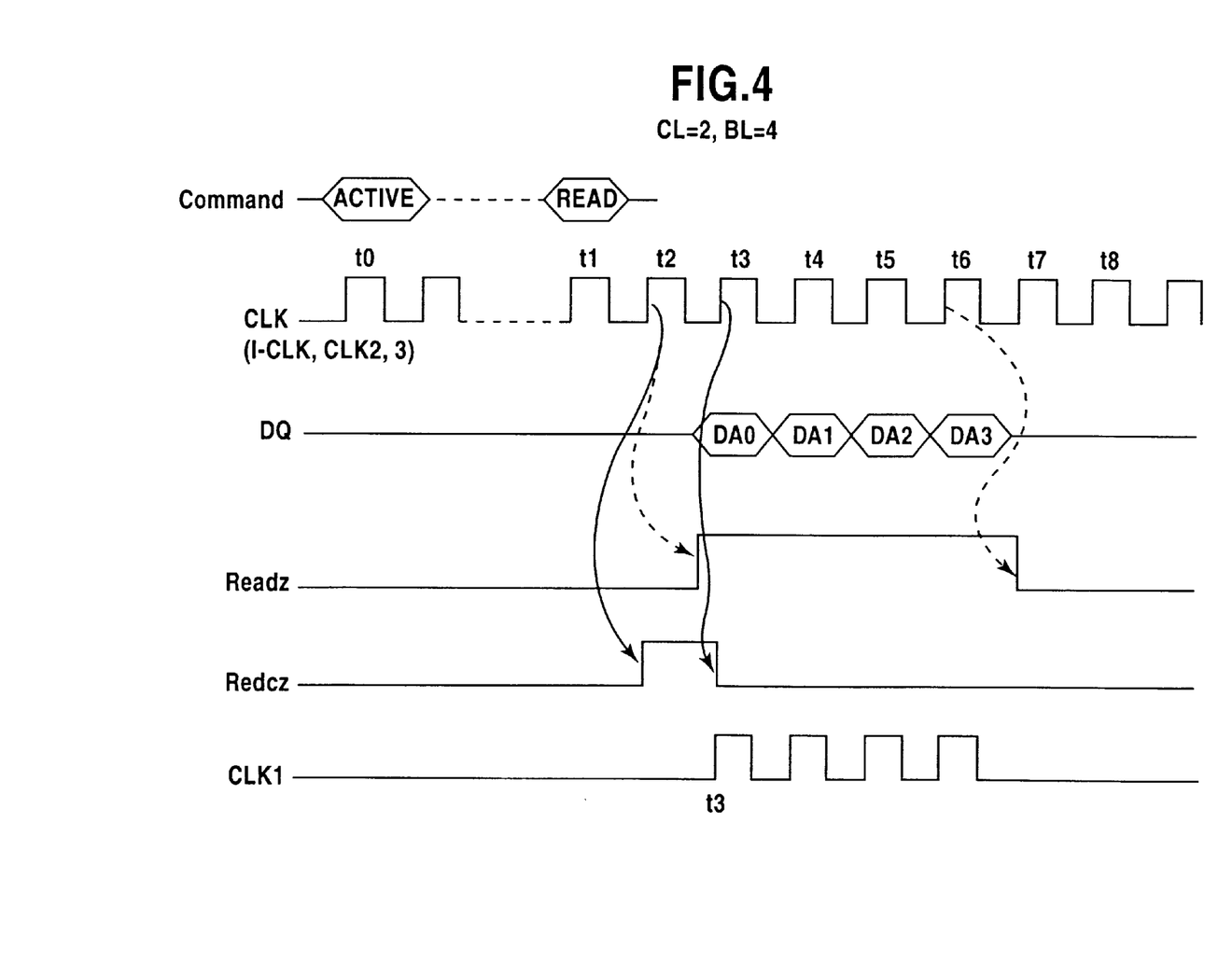
FIG. 4 is a timing chart representing clock signal supply action.

FIG. 4 is a timing chart for the action of supplying clock signals. The timing chart given in FIG. 4 is for a case where the CAS latency is set to CL=2 and the burst length is set to BL=4. Inside the memory device, during the time that the non-power-down state is in effect, a clock signal CLK from the outside are taken in as the clock signal I-CLK. During the time that the non-power-down state is in effect, moreover, the internal clock signal I-CLK is supplied continuously as control clock signals CLK2, CLK3, etc., respectively, to the internal data read circuit 30 and the address buffer 14, etc.

In the example represented in FIG. 4, at time t0, an active command ACTIVE is supplied, after which, at time t1, a read command READ is supplied. In response to the active command ACTIVE, a row address is loaded, and the word line WL is selected and driven by the row decoder 12. The very small voltages generated on the pair of bit lines BL and /BL are detected and amplified by the sense amp SA.

Next, at time t1, when a read command READ is supplied, in response thereto, a column address is loaded into the address buffer 14, a column is selected by the column decoder 16, and the output of the sense amp SA for the selected column is connected to the pair of data bus lines DB and /DB. A pipeline gate inside the internal data read circuit 30 that is a CAS-system circuit opens in response to the control clock signal CLK2, and a data read operation is performed. Then, at the timing t3 after two clock pulses with the CAS latency set at CL=2 after the read command READ is supplied, the data output circuit 40 outputs the read data DA0. After that, data DA0–DA3, whose number is a burst length BL=4, are output in synchronization with the rising edge of the clock signal CLK.

Accordingly, it is necessary that the control clock signal CLK1 be supplied during the time period from t3 to t6 wherein at least the read data DA0–DA3 are output. Thereupon, in response to the read command signal READ, the clock supply control signal generator circuit 72 references the CAS latency CL=2 set in the mode register 78, and, in response to the rising edge of the clock signal I-CLK (at time t2), i.e. one pulse earlier than time t3 after two clock pulses after time t1, raises the first clock supply control signal Readz to the H level. Also, the second clock supply control signal Redcz is raised to the H level only during the interval of one clock period from the rising edge at time t2.

The H levels of these clock supply control signals are supplied to the clock signal supply circuit 56, pass through the NOR gate 65 and the inverter 64, and open the NAND gate 63, whereupon supply of the clock signal I-CLK is enabled. As a result, the supply of the control clock signal CLK1 to the data output circuit 40 begins from time t3. The details of the configuration of the clock signal supply circuit 56 are diagrammed in FIG. 3. This configuration, specifically, comprises a gate 66 that opens when the clock signal I-CLK is low (L), and a latching circuit 67 that latches the output of the NOR gate 65. Accordingly, in the example diagrammed in FIG. 4, the H level of the second clock supply control signal Redcz generated in response to the rising edge of the clock signal at time t2 is latched in the latching circuit 67 at the next falling edge of the clock pulse. As a result of this inverted signal, the NAND gate 63 opens. Accordingly, the supply of the clock signal I-CLK begins without fail at the rising edge at time t3.

After the second clock supply control signal Redcz goes low (L), the first clock supply control signal Readz is high (H), wherefore, in like manner, the open state of the NAND gate 63 is maintained, and the supply of the control clock signal CLK1 thereafter is continued. Due to the configuration of the internal circuitry, after time t2, even when the change to the H level of the first clock supply control signal Readz is delayed, the control signal Redczs will have become high (H) for the one clock period prior thereto, wherefore the supply of the clock signal CLK1 will begin without fail at time t3.

Next, when the read data DA0–DA3, i.e. that number of data equal to the burst length BL=4, are output, there will no longer be any need to supply the control clock signal CLK1 to the data output circuit 40. That being so, the clock supply control signal generator circuit 72 switches the level of the first clock supply control signal Readz to low (L) in response to the rising edge at time t6, that is, the number of clock pulses after time t3 corresponding to the burst length BL=4. As a result, the supply of the clock signal CLK1 is disabled from time t7 on.

As described in the foregoing, the clock supply control signal generator circuit 72 generates clock supply control signals with reference to a preset CAS latency CL and burst length BL, so that the control clock signal CLK1 is only supplied to the data output circuit 40 during the time period when read data DA0–DA3 are being output. It also generates clock supply control signals so that the supply of the control clock signal CLK1 is disabled at all other times. Accordingly, the number of times that the control clock signal CLK1 is driven is held to a minimum, and the large current consumption associated with this drive is also reduced to a minimum.

Figure 5:
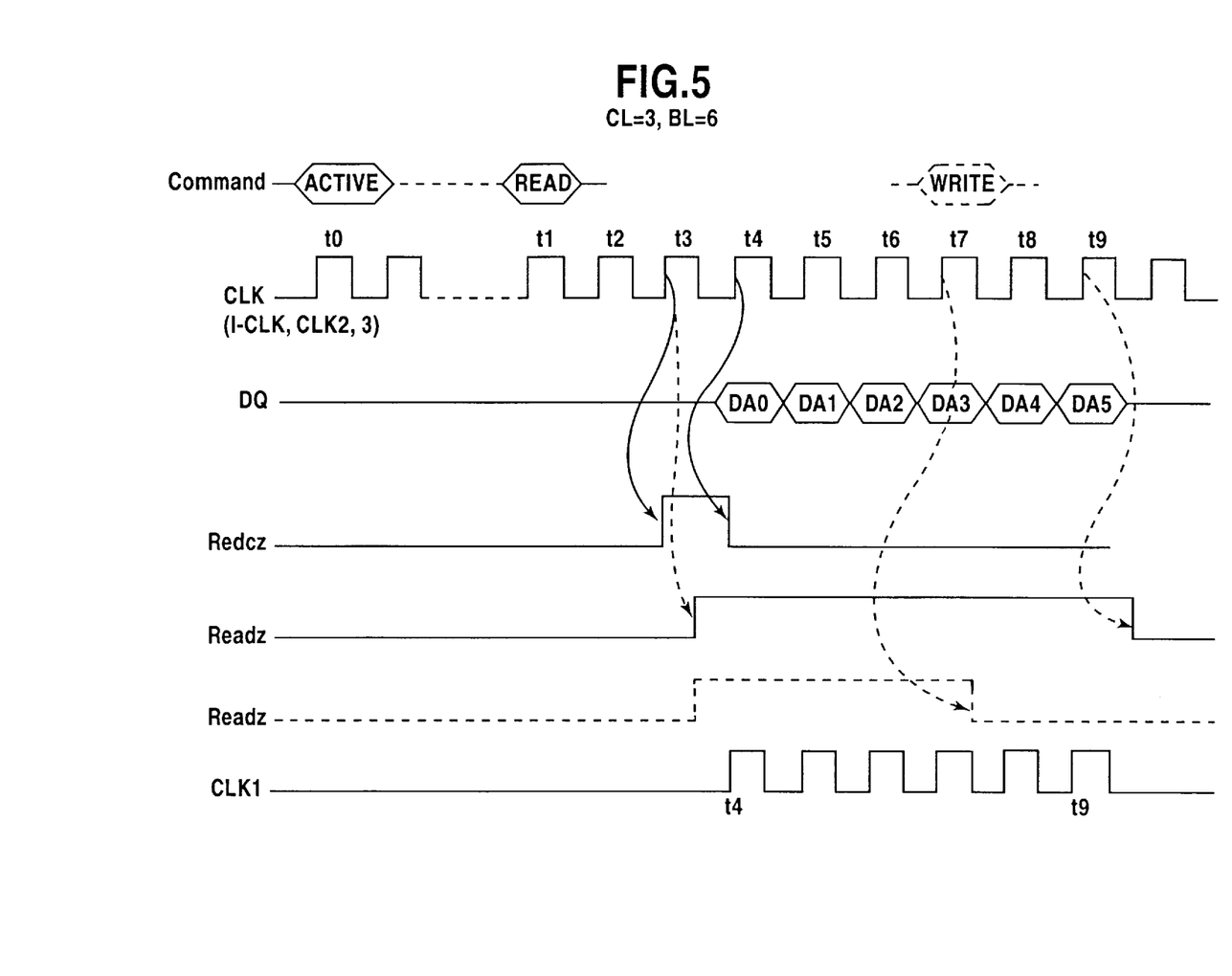
FIG. 5 is another timing chart representing clock signal supply action.

FIG. 5 is another timing chart for the action of supplying clock signals. The timing chart given in FIG. 5 is for a case where the CAS latency is set to CL=3 and the burst length is set to BL=6. Here, as in the case represented in FIG. 4, when the non-power-down state is in effect, the external clock signal CLK is taken into the internal circuitry as the internal clock signal I-CLK, and, irrespective of the read status being in effect, the control clock signals CLK2 and CLK3 are supplied continuously to the internal data read circuit 30 and address buffer 14, etc.

In the example represented in FIG. 5, the CAS latency is set at CL=3, wherefore the second clock supply control signal Redcz goes high (H) in response to the rising edge of the clock signal at time t3, one clock pulse later than in FIG. 4, and the first clock supply control signal Readz goes high (H) after a further delay. Then, in response to the rising edge at time t9 corresponding to the burst length BL=6, the high level state of the first clock supply control signal Readz ends. Accordingly, the supply of the control clock signal CLK1 to the data output circuit 40 begins at the rising edge at time t4 and ends after the rising edge at time t9. During this interval, six read data DA0–DA5, corresponding to the burst length BL=6, are output from the data output circuit 40 to the I/O terminals DQ.

In FIG. 5, the waveform of the first clock supply control signal Readz when a write command WRITE is supplied at the rising edge of the clock signal at time t7 while the burst read operation, is indicated by a broken line. In other words, when a write command WRITE is supplied at the rising edge of the clock signal at time t7, the command decoder 52 generates a write command signal (not shown) and, at the same time, generates an interrupt signal INT. The generation of this write command means that the read operation is canceled thereafter and a write operation will be performed. Accordingly, after the reception of the write command, it is no longer necessary to supply the control clock signal CLK1 to the data output circuit 40. That being so, in response to this interrupt signal INT, the clock supply control signal generator circuit 72 controls the first clock supply control signal Readz so that it goes low (L). As a result, the supply of the control clock signal CLK1 from time t8 on is stopped.

The clock supply control signal generator circuit 72 diagrammed in FIG. 3 latches the read command signal READ, so that the level of the clock supply control signal goes high (H) in response thereto, whereby the control clock signal CLK1 can be supplied to the data output circuit 40 only during the time period that the read status is in effect. The supply of the control clock signal CLK1 can be stopped by having the latched state of the read command signal READ released by another command signal, for example.

As described in the embodiment aspect example described earlier, moreover, current consumption can be further reduced by having the clock supply control signal generator circuit 72 reference the CAS latency CL and burst length BL, and supply the control clock signal CLK1 only while read data DA from the data output circuit 40 is actually being output with the read status in effect.

Figure 6:
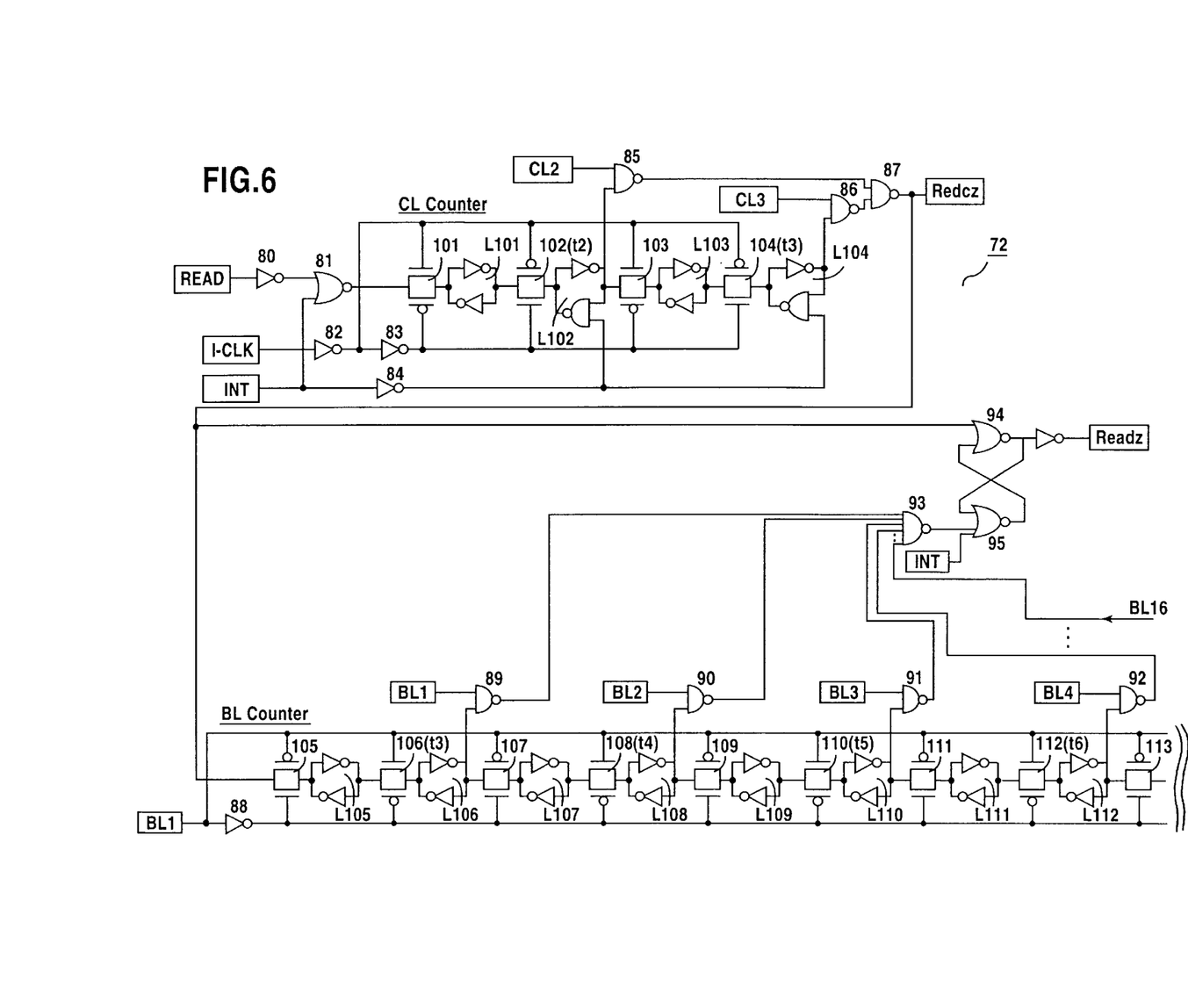
FIG. 6 is a circuit diagram of clock supply control signal generator circuit.

FIG. 6 is a circuit diagram of the clock supply control signal generator circuit. The clock supply control signal generator circuit 72 includes a CL counter for generating the second clock supply control signal Redcz and a BL counter for generating the first clock supply control signal Readz. The read command signal READ, the interrupt signal INT and the internal clock I-CLK are supplied to the clock supply control signal generator circuit 72. Further, the CAS latency signals CL2 and CL3 are supplied to the CL counter. The CAS latency signals CL2 and CL3 become H level when the CAS latency is 2 and 3 respectively. Similarly, the burst length signals BL1, BL2, BL3, BL4, . . . BL16 are supplied to the BL counter and become H level when the burst length is 1, 2, 3, 4,. . . 16 respectively.

The CL counter comprises transfer gates 101, 102, 103 and 104 and latch circuits L101, L102, L103 and L104. The H level read command signal READ is transferred to each latch circuit L101, L103 via the transfer gates 101 and 103 in response to a falling edge of the internal clock I-CLK, and also is transferred to each latch circuit L102, L104 via the transfer gates 102 and 104 in response to a rising edge of the internal clock I-CLK.

In case the CAS latency value is set to 2, CL2=H, as shown in FIG. 4, when the transfer gate 102 transfers the H level read command signal READ to the latch circuit L102 in response to the rising edge of the internal clock I-CLK at t2, NAND gate 85 output L level so as to have the second clock supply control signal Redcz H level. Since the read command signal READ is a pulse signal which is H level during one clock cycle, the control signal Redcz becomes L level at the next internal clock I-CLK.

In case the CAS latency value is set to 3, CL3=H, as shown in FIG. 5, when the transfer gate 104 transfers the H level read command signal READ to the latch circuit L104 in response to a rising edge of the internal clock I-CLK at t3, NAND gate 86 output L level so as to have the second clock supply control signal Redcz H level.

The H level control signal Redcz is latched by a latch circuit comprised by NOR gates 94 and 95 so that the first clock supply control signal Readz becomes H level. Therefore, as shown in FIG. 4 (FIG. 5), the control signal Readz becomes H level in response to the rising edge of the internal clock I-CLK at t2 (t3).

The BL counter has the similar clock transfer circuit as the CL counter. Transfer gates 105, 107, 109, 111, 113, . . . are conductive so as to transfer the control signal Redcz in response to each falling edge of the internal clock I-CLK. Transfer gates 106, 108, 110, 112, . . . are conductive in response to each rising edge of the internal clock I-CLK. Further, latch circuits L105–L112 are provided between the transfer gates.

In case the burst length BL is set to 4, BL4=H as shown in FIG. 4, the transfer gates 106, 108, 110 and 112 transfer the H level second control signal Redcz to the following latch circuit L106, L108, L110 and L112 at t3, t4, t5, t6 respectively, and the NAND gate 92 output H level when the latch circuit L112 holds the H level Redcz. Then, output of NAND gate 93 resets the latch circuit made by 94 and 95 so as to cause the first clock supply control signal Readz L level.

As shown in FIG. 6, the BL counter causes the first clock supply control signal Readz L level in the timing set by the burst length signal BL1–BL16.

Further, when the interrupt signal INT becomes H level in response to the write command WRITE, the second control signal Redcz becomes L level via the latch circuits L102, L104 by the interrupt signal INT so that the first control signal Readz also becomes L level thereafter.

As based on the present invention, as described in the foregoing, consumption of the drive current associated with the supply of control clock signals in a clock-synchronized memory device can be reduced by limiting the period of control clock signal supply to the data output circuit to the time that a read status is in effect.

As based on the present invention, furthermore, the drive current associated with the supply of control clock signals in a clock-synchronized memory device can be further reduced by limiting the supply of control clock signals to the data output circuit in such manner that the supply of control clock signals is limited only to periods that are further limited, in accordance to a preset CAS latency and burst length, when in the read status.

What is claimed is:

1. A memory device operating in synchronization with a clock signal, comprising:

a memory cell region for storing data;

an input buffer for inputting signals to said memory cell region in synchronization with a clock signal;

a data output circuit for outputting data read out from said memory cell region in synchronization with said clock signal after a delay time corresponding to a value of a CAS latency signal in a read mode; and a clock signal supply circuit for supplying said input buffer with said clock signal irrespective of said read mode being in effect or not and for supplying said data output circuit with said clock signal after said delay time corresponding to said value of said CAS latency signal in said read mode.

2. The memory device according to claim 1 wherein said clock signal supply circuit supplies said clock signal to an internal read circuit irrespective of said read mode being in effect or not.

3. A memory device operating in synchronization with a clock signal, comprising:

a memory cell region for storing data;

an input buffer for inputting signals to said memory cell region in synchronization with a clock signal;

a data output circuit for outputting data read out from said memory cell region in synchronization with said clock signal which is disabled after a delay time corresponding to a value of a burst length signal in a read mode; and a clock signal supply circuit for supplying said input buffer with said clock signal irrespective of said read mode being in effect or not and for supplying said data output circuit with said clock signal which is disabled after said delay time corresponding to said value of said burst length signal in said read mode.

4. The memory device according to claim 1, wherein: said clock supply control signal generator circuit generates a second clock supply control signal for enabling supply of said clock signal in a prescribed time period prior to completion of a number of clock pulses corresponding to a set CAS latency, after reception of said read command; and said clock signal supply circuit supplies said clock signal to said data out put circuit in response to said second clock supply control signal.

5. A memory device operating in synchronization with a clock signal, comprising:

a memory cell region for storing data;

an input buffer for inputting signals to said memory cell region in synchronization with a clock signal;

a data output circuit for outputting data read out from said memory cell region in synchronization with said clock signal in a time mode corresponding to values of a CAS latency signal and a burst length signal; and a clock signal supply circuit for supplying said input buffer with said clock signal irrespective of said read mode being in effect or not and for supplying said data output circuit with said clock signal in said time mode corresponding to values of said CAS latency signal and said burst length signal.

6. The memory device according to claim 5 wherein said clock signal supply circuit supplies said clock signal to an internal read circuit irrespective of said read mode being in effect or not.

7. The memory device according to claim 5, wherein: said clock signal supply circuit also supplies said clock signal to said data output circuit, in said read mode after reception of a read command, during prescribed time period prior to completion of a number of click pulses corresponding to a set CAS latency after reception of said read command.

8. The memory device according to claim 3, further comprising an input buffer for inputting signals supplied in synchronization with the clock signal, wherein: said clock signal supply circuit supplies said clock signal to said input buffer irrespective of said read mode being in effect.

* * * * *

UNITED STATES PATENT AND TRADEMARK OFFICE
CERTIFICATE OF CORRECTION

PATENT NO.    : 6,337,833 B1
DATED         : January 8, 2002
INVENTOR(S)   : K. Kanazashi It is certified that error appears in the above-identified patent and that said Letters Patent is hereby corrected as shown below:

<u>Column 10,</u>
Lines 39 and 42, delete "time mode" and insert -- read mode --.

Signed and Sealed this

Eighth Day of June, 2004

JON W. DUDAS
*Acting Director of the United States Patent and Trademark Office*